United States Patent Office 3,352,712
Patented Nov. 14, 1967

3,352,712

METHOD OF STABILIZING SEMI-CONDUCTOR DEVICES HAVING EXPOSED SURFACES OF A HYDROPHILIC OXIDE

Murray A. Polinsky, Somerville, and George F. Damon, Chatham, N.J., assignors to Radio Corporation of America, a corporation of Delaware No Drawing. Filed Aug. 28, 1964, Ser. No. 392,911
10 Claims. (Cl. 117—201)

This invention relates generally to a method of treating an exposed surface of a hydrophilic silicon oxide to render it hydrophobic. The method of the invention can be utilized to stabilize the operating characteristics of semiconductor devices that have surfaces of silicon dioxide exposed to the ambient. The improved method of the present invention is particularly useful for stabilizing a partial-gate metal-oxide-semiconductor (MOS) transistor.

A partial-gate MOS transistor is a planar-type, field-effect transistor in which a gate electrode is offset towards a source electrode and away from a drain electrode. By offsetting the gate electrode in this manner, the input-to-output capacitance of the transistor is reduced and its frequency response characteristics are increased. This offset, however, exposes the surface of a layer of silicon dioxide to the ambient and to reagents used during the manufacturing process from which it tends to absorb moisture and ions that adversely affect the stability and useful operating life of the transistor.

In accordance with the present invention the exposed silicon dioxide surface of the partial-gate MOS transistor is rendered hydrophobic and substantially all the surface ions are rendered immobile, thus rendering the operating characteristics of the transistor more stable and lengthening its useful life.

It is an object of the present invention to provide an improved method of treating the hydrophilic surface of silicon dioxide to render it hydrophobic.

Another object of the present invention is to provide an improved method of stabilizing the operation of a semiconductor device that initially has hydrophilic silicon dioxide on its surface.

Such hydrophilic silicon dioxide tends to affect the operation of the semiconductor device adversely.

Still another object of the present invention is to provide an improved method of stabilizing the operating characteristics of a partial-gate MOS transistor and of increasing its useful life.

A further object of the present invention is to provide an improved method of rendering the surface of a silicon-dioxide layer hydrophobic, whereby ambient moisture is prevented from adversely affecting the operating characteristics of a semiconductor device of which the silicon dioxide layer is a part.

The improved method of stabilizing semiconductor devices having exposed hydrophilic silicon dioxide surfaces will be described in connection with a partial-gate MOS transistor of the type described above. However, the stabilization method of the present invention is applicable to other semiconductor devices that have exposed hydrophilic silicon dioxide surfaces.

Briefly stated, the improved method of the present invention of treating a semiconductor material having an exposed hydrophilic surface of silicon dioxide to render the surface hydrophobic comprises the steps of (a) heating the surface to dry it, (b) exposing the surface to liquid benzene sulfonic acid or ethane sulfonic acid, (c) removing the excess acid from the surface and drying the surface. All of the operations should be conducted under controlled conditions of time and temperature, and preferably in a moisture-free ambient. The sulfonic acid used should be substantially moisture free.

The novel features of the present invention, both as to its organization and operation, as well as additional objects and advantages thereof, will be more readily understood from the following description.

The improved method of stabilizing a partial-gate MOS transistor, hereinafter referred to as the transistor, is preferably applied to the transistor after the latter has been manufactured, that is, completely formed. The method is carried out preferably in a moisture-free ambient, such as in a dry box. By a dry box, as used herein, is meant a region through which an inert gas, such as dried and filtered nitrogen, is caused to flow continuously under a pressure slightly in excess of atmospheric pressure. The rate of flow of the gas is about 30 cubic feet per hour. Access to the dry box may be by means of flexible rubber gloves which extend into the box and into which an operator's hands may be inserted from outside the box to carry out the method operations within the box.

The transistor to be stabilized is first dried. This may be accomplished by placing the transistor on a hot plate within the dry box. The upper surface of silicon dioxide between the gate and the drain electrodes of the transistor is exposed to the substantially moisture-free ambient for about four to six minutes while the hot plate is maintained at a temperature of from 280° to 320° F. The dew point of the ambient in the dry box should be equivalent to at least that of the atmosphere under moisture saturated conditions at a temperature of −40° F. This drying operation removes most of the moisture from the silicon dioxide, leaving only a thin film of water, if any, adhered to the surface.

Next, the silicon-dioxide surface of the heated and dried transistor is exposed to substantially moisture-free, heated, liquid benzene sulfonic acid or ethane sulfonic acid. This operation may be accomplished by dipping the transistor into a container of one of the aforementioned sulfonic acids for a period of from 25 to 35 minutes. If benzene sulfonic acid is used, the acid is maintained at a temperature of between 80 and 130° C. If ethane sulfonic acid is used, the acid is maintained at a temperature of between 30 and 50° C. While the aforementioned times and temperatures are recommended, they are not critical. Benzene sulfonic acid is preferred to ethane sulfonic acid to render silicon dioxide hydrophobic, the former acid providing better results. During this operation, it is believed that water is formed as a reaction product between the acid and the hydroxyl groups on the hydrophilic silicon dioxide, as will hereinafter be explained. Since the melting point of benzene sulfonic acid is about 65° C., the acid has to be molten to liquefy it. Thus, by the term "liquid benzene sulfonic acid," as used herein, is meant molten acid. Ethane sulfonic acid has a melting point of −17° C.

The transistor is now removed from the sulfonic acid and rinsed in an anhydrous lower alcohol, such as, for example, methyl alcohol, ethyl alcohol, or preferably isopropyl alcohol. While this rinsing may be done outside the dry box, it is preferable that this rinsing operation also be carried out within the dry box. Since the silicon dioxide surface of the transistor is hydrophobic when it is removed from the acid, the rinsing may even be done with water, but an alcohol rinse is preferable to remove excess acid from the surface. Other solvents for the sulfonic acids used may also be employed in the rinsing operation.

Finally, the hydrophobic oxide surface is dried. The drying operation may be accomplished by permitting the transistor to dry normally within the dry box. A preferable drying operation, however, is to blow a dry inert gas, such as filtered dried nitrogen, over the transistor until the oxide surface is dry. When thoroughly dried.

the transistor should be stored in a moisture-free atmosphere until needed.

It is believed that the hydrophilic oxide surface is rendered hydrophobic by the sulfonic acid because hydroxyl groups of the hydrophilic silicon dioxide react with the hydrogen of the sulfonic acid to form water as a reaction product. For example, the hydrophilic surface of silicon dioxide is believed to combine with benzene sulfonic acid in the following manner:

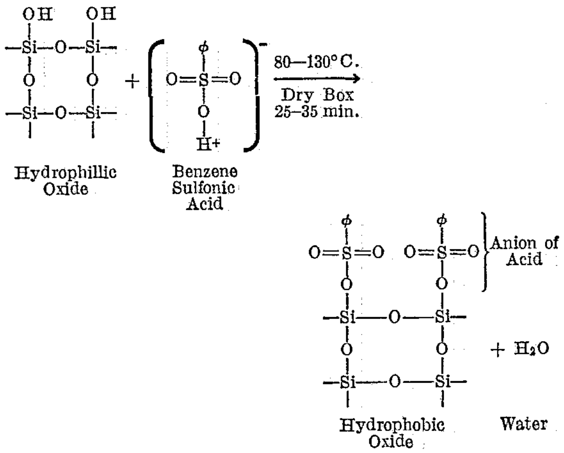

$\phi = C_6H_5$

From the above reaction, it will be observed that the hydroxyl radical on the surface of the hydrophilic silicon dioxide is replaced with the anion (negative radical) of the acid. One of the reaction products, water, is removed by the subsequent alcohol rinse. The benzene sulfonic anion which took the place of the hydroxyl radical in the hydrophilic oxide is hydrophobic and is believed to form a substantially monomolecular water-repellent barrier on the oxide. In other words, by means of this reaction, it is believed that adhered water on the surface of the silicon dioxide is removed, the hydrophobic phenyl ($C_6H_5$) group is oriented toward the ambient, and unwanted surface ions are rendered immobile. Therefore, the operation of the MOS transistor is considerably stabilized.

From the foregoing description, it can be seen that there has been provided an improved method of treating a hydrophilic surface of silicon dioxide to render it hydrophobic. While the improved method of the invention has been described in connection with the stabilization of the operating characteristics of a partial-gate MOS transistor, variations in the method, all coming within the spirit of this invention, will, no doubt, readily subject themselves to those skilled in the art. Hence, it is desired that the foregoing shall be considered as illustrative and not in a limiting sense.

What is claimed is:

1. A method of treating a material having an exposed hydrophilic surface of silicon dioxide thereon to render said surface hydrophobic, said method comprising the steps of
   heating said surface to dry it,
   contacting said surface with a heated liquefied sulfonic acid selected from the group consisting of benzene sulfonic acid and ethane sulfonic acid to produce a reaction between said oxide surface and said silicon dioxide rendering said surface hydrophobic,
   removing excess of said sulfonic acid from said surface, and
   drying said surface.

2. A method of treating a semiconductor material having an exposed hydrophilic surface of an oxide of silicon thereon to render said surface hydrophobic, said method comprising the steps of
   heating said surface to dry it,
   contacting said surface with benzene sulfonic acid for about 30 minutes to produce a reaction between said oxide surface and said acid rendering said surface hydrophobic, said sulfonic acid being maintained at a temperature of between 80 and 130° C., and
   drying said surface.

3. A method of treating a semiconductor material having an exposed hydrophilic surface of an oxide of silicon thereon to render said surface hydrophobic, said method comprising the steps of
   heating said surface to dry it,
   contacting said surface with ethane sulfonic acid for about 30 minutes to produce a reaction between said oxide surface and said acid, said sulfonic acid being maintained at a temperature of between 30 and 50° C.,
   removing excess ethane sulfonic acid from said surface, and
   drying said surface.

4. A method of stabilizing a semiconductor device having an exposed hydrophilic surface of silicon dioxide thereon, said method comprising the steps of
   exposing said surface to heated liquefied benzene sulfonic acid at a temperature of between 80 and 130° C. for about 25 to 35 minutes,
   rinsing said surface in a solvent for benzene sulfonic acid, and
   drying said surface, said steps of exposing, rinsing, and drying being carried out in a substantially moisture-free ambient.

5. A method of stabilizing a semiconductor device having an exposed hydrophilic surface of silicon dioxide thereon, said method comprising the steps of
   heating said device to dry said surface,
   exposing said surface to heated, liquid benzene sulfonic acid at a temperature of between 80 and 130° C. for about 30 minutes,
   rinsing said surface in a solvent for benzene sulfonic acid selected from the group consisting of methyl alcohol, ethyl alcohol, and isopropyl alcohol, and
   drying said surface.

6. A method of stabilizing a semiconductor device having an exposed hydrophilic surface of silicon dioxide thereon, said method comprising the steps of
   heating said device to dry said surface,
   exposing said surface to heated liquid ethane sulfonic acid at a temperature of between 30 and 50° C. for about 30 minutes,
   rinsing said surface in a solvent for benzene sulfonic acid selected from the group consisting of methyl alcohol, ethyl alcohol, and isopropyl alcohol, and
   drying said surface.

7. A method of stabilizing a semiconductor device having an exposed surface of a hydrophilic oxide of silicon thereon, said method comprising the steps of
   heating said device at a temperature of between 280° F. and 320° F. in a moisture-free ambient for about 4 to 6 minutes,
   exposing said surface to benzene sulfonic acid for about 25 to 35 minutes in a moisture-free atmosphere, said acid being at a temperature of between 80° C. and 130° C.,
   removing said device from said benzene sulfonic acid and rinsing it in isopropyl alcohol in a moisture-free ambient, and
   drying said device in a moisture-free ambient.

8. A method of stabilizing a semiconductor device having an exposed surface of a hydrophilic oxide of silicon thereon, said method comprising the steps of
   heating said device at a temperature of between 280° F. and 320° F. in a moisture-free ambient for about 4 to 6 minutes,
   exposing said surface to ethane sulfonic acid for about 25 to 35 minutes in a moisture-free atmosphere, said acid being at a temprature of between 30° C. and 50° C.,
   removing said device from said benzene sulfonic acid and rinsing it in isopropyl alcohol in a moisture-free ambient, and drying said device in a moisture-free ambient.

9. A method of stabilizing a semiconductor device having an exposed surface of hydrophilic silicon dioxide thereon, said method comprising the steps of heating said device at a temperature of between 280° F. and 320° F. in a moisture-free ambient for about 4 to 6 minutes, exposing said surface to benzene sulfonic acid for about 25 to 35 minutes in a moisture-free atmosphere, said acid being at a temperature of between 80° C. and 130° C., removing said device from said acid and rinsing it in a lower alcohol selected from the group consisting of methyl alcohol, ethyl alcohol, and isopropyl alcohol in a moisture-free ambient, and drying said device in a moisture-free ambient.

10. A method of stabilizing a semiconductor device having an exposed surface of hydrophilic silicon dioxide thereon, said method comprising the steps of heating said device at a temperature of between 280° F. and 320° F. in a moisture-free ambient for about 4 to 6 minutes, exposing said surface to ethane sulfonic acid for almost 25 to 35 minutes in a moisture-free atmosphere, said acid being at a temperature of between 30° C. and 50° C., removing said device from said acid and rinsing it in a lower alcohol selected from the group consisting of methyl alcohol, ethyl alcohol, and isopropyl alcohol in a moisture-free ambient, and drying said device in a moisture-free ambient.

No references cited.

WILLIAM L. JARVIS, *Primary Examiner.*